US010909901B2

(12) United States Patent
Wu et al.

(10) Patent No.: US 10,909,901 B2
(45) Date of Patent: Feb. 2, 2021

(54) PIXEL ARRANGEMENT, MANUFACTURING METHOD THEREOF, DISPLAY PANEL, DISPLAY DEVICE AND MASK

(71) Applicant: BOE TECHNOLOGY GROUP CO., LTD., Beijing (CN)

(72) Inventors: Haidong Wu, Beijing (CN); Yansong Li, Beijing (CN); Weilong Zhou, Beijing (CN); Shanshan Bai, Beijing (CN); Yue Liu, Beijing (CN); Zhihui Xiao, Beijing (CN); Yangpeng Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 72 days.

(21) Appl. No.: 16/462,776

(22) PCT Filed: Dec. 20, 2018

(86) PCT No.: PCT/CN2018/122205
§ 371 (c)(1),
(2) Date: May 21, 2019

(87) PCT Pub. No.: WO2019/134521
PCT Pub. Date: Jul. 11, 2019

(65) Prior Publication Data
US 2020/0357322 A1  Nov. 12, 2020

(30) Foreign Application Priority Data

Jan. 2, 2018 (CN) .......................... 2018 1 0002739
Feb. 9, 2018 (CN) .......................... 2018 1 0135146

(51) Int. Cl.
*G09G 3/20* (2006.01)
*G09G 3/3208* (2016.01)
*H01L 27/32* (2006.01)

(52) U.S. Cl.
CPC .......... *G09G 3/2003* (2013.01); *G09G 3/3208* (2013.01); *H01L 27/3216* (2013.01); *H01L 27/3218* (2013.01); *G09G 2300/0452* (2013.01)

(58) Field of Classification Search
CPC ............... G09G 3/2003; G09G 3/3208; G09G 2300/0452; H01L 27/3216; H01L 27/3218
See application file for complete search history.

(56) References Cited

U.S. PATENT DOCUMENTS

| 2013/0234917 A1 | 9/2013 | Lee | |
| 2014/0022290 A1* | 1/2014 | Saigo | G09G 3/2003 345/694 |

(Continued)

FOREIGN PATENT DOCUMENTS

| CN | 103311266 A | 9/2013 |
| CN | 103941490 A | 7/2014 |

(Continued)

OTHER PUBLICATIONS

International Search Report and Written Opinion of the International Searching Authority (with English language translation), International Application No. PCT/CN2018/122021, dated Feb. 27, 2019, 11 pp.

(Continued)

*Primary Examiner* — Michael Pervan
(74) *Attorney, Agent, or Firm* — Myers Bigel, P.A.

(57) ABSTRACT

A pixel arrangement includes a plurality of first groups of sub-pixels arranged in a first direction, each first group including first sub-pixels and third sub-pixels arranged alternately. A plurality of second groups of sub-pixels are arranged in the first direction, each second group including third sub-pixels and second sub-pixels alternately arranged. The first groups and the second groups are alternately arranged in a second direction intersecting the first direction.

(Continued)

The first groups and the second groups are arranged to form a plurality of third groups of sub-pixels arranged in the second direction and a plurality of fourth groups of sub-pixels arranged in the second direction. The third groups and the fourth groups are alternately arranged in the first direction, each third group including first sub-pixels and third sub-pixels alternately arranged, each fourth group including third sub-pixels and second sub-pixels alternately arranged.

20 Claims, 12 Drawing Sheets

(56) References Cited

U.S. PATENT DOCUMENTS

| | | | |
|---|---|---|---|
| 2015/0091785 A1* | 4/2015 | Lee | H01L 27/3218 345/77 |
| 2015/0109268 A1 | 4/2015 | Huang et al. | |
| 2015/0162391 A1 | 6/2015 | Kim | |
| 2015/0364075 A1* | 12/2015 | Sato | G09G 3/3233 345/698 |
| 2016/0253943 A1 | 9/2016 | Wang | |
| 2017/0287988 A1 | 10/2017 | Lee et al. | |
| 2017/0294491 A1 | 10/2017 | Jo et al. | |
| 2017/0309688 A1 | 10/2017 | Lee et al. | |
| 2018/0357953 A1 | 12/2018 | Hu | |
| 2018/0366052 A1 | 12/2018 | Shi | |
| 2019/0035861 A1 | 1/2019 | Wang et al. | |
| 2019/0252469 A1* | 8/2019 | Xiao | H01L 27/3216 |

FOREIGN PATENT DOCUMENTS

| | | | |
|---|---|---|---|
| CN | 104282727 A | 1/2015 |
| CN | 104701341 A | 6/2015 |
| CN | 105826349 A | 8/2016 |
| CN | 106298851 A | 1/2017 |
| CN | 106486513 A | 3/2017 |
| CN | 106920832 A | 7/2017 |
| CN | 107248378 A | 10/2017 |
| CN | 107275359 A | 10/2017 |
| CN | 107275360 A | 10/2017 |
| CN | 107305905 A | 10/2017 |
| CN | 207966985 U | 10/2018 |
| CN | 207966994 U | 10/2018 |
| CN | 207966995 U | 10/2018 |
| KR | 1020170116598 A | 10/2017 |

OTHER PUBLICATIONS

International Search Report and Written Opinion of the International Searching Authority (with English language translation), International Application No. PCT/CN2018/122205, dated Feb. 27, 2019, 14 pp.

International Search Report and Written Opinion of the International Searching Authority (with English language translation), International Application No. PCT/CN2018/122206, dated Mar. 25, 2019, 11 pp.

International Search Report and Written Opinion of the International Searching Authority (with English language translation), International Application No. PCT/CN2018/122063, dated Mar. 18, 2019, 13 pp.

International Search Report and Written Opinion of the International Searching Authority (with English language translation), International Application No. PCT/CN2018/122022, dated Mar. 26, 2019, 11 pp.

* cited by examiner

1100C ical Field

The present disclosure relates to the field of display, and in particular, to a pixel arrangement, a method of manufacturing the pixel arrangement, a display panel, a display device, and a mask.

PIXEL ARRANGEMENT, MANUFACTURING METHOD THEREOF, DISPLAY PANEL, DISPLAY DEVICE AND MASK

CROSS-REFERENCE TO RELATED APPLICATIONS

The present application is a 35 U.S.C. 371 national stage application of PCT International Application No. PCT/CN2018/122205, filed on Dec. 20, 2018, which claims the benefit of Chinese Patent Application No. 201810002739.4, filed on Jan. 2, 2018, and claims the benefit of Chinese Patent Application No. 201810135146.5, filed on Feb. 9, 2018, the contents of which are incorporated herein by reference in their entireties.

TECHNICAL FIELD

The present disclosure relates to the field of display, and in particular, to a pixel arrangement, a method of manufacturing the pixel arrangement, a display panel, a display device, and a mask.

BACKGROUND

Compared with liquid crystal displays (LCDs), organic electroluminescent (OLED) displays have advantages such as low energy consumption, low production cost, self-illumination, wide viewing angle and fast responsiveness. Currently, in the field of flat panel displays such as mobile phones, PDAs, and digital cameras, OLED display devices have begun to replace traditional liquid crystal displays.

An OLED display typically includes a base substrate and sub-pixels arranged in a matrix on the base substrate. The sub-pixels are generally formed by evaporating an organic light-emitting material onto an array substrate using a fine metal mask (FMM).

SUMMARY

According to an aspect of the present disclosure, a pixel arrangement is provided, comprising: a plurality of first groups of sub-pixels arranged in a first direction, each of the plurality of first groups comprising a plurality of first sub-pixels and a plurality of third sub-pixels arranged alternately; and a plurality of second groups of sub-pixels arranged in the first direction, each of the plurality of second groups comprising a plurality of third sub-pixels and a plurality of second sub-pixels arranged alternately. The plurality of first groups and the plurality of second groups are alternately arranged in a second direction intersecting the first direction. The plurality of first groups and the plurality of second groups are arranged to form a plurality of third groups of sub-pixels arranged in the second direction and a plurality of fourth groups of sub-pixels arranged in the second direction, the plurality of third groups and the plurality of fourth groups are alternately arranged in the first direction, each of the plurality of third groups comprising a plurality of first sub-pixels and a plurality of third sub-pixels alternately arranged, each of the plurality of fourth groups comprising a plurality of third sub-pixels and a plurality of second sub-pixels arranged alternately. Each of the first sub-pixels in each of the plurality of first groups has a same first minimum distance from its two directly adjacent ones of the third sub-pixels in that first group, and each of the first sub-pixels in each of the plurality of third groups has a same second minimum distance from its two directly adjacent ones of the third sub-pixels in that third group, the first minimum distance being unequal to the second minimum distance.

In some embodiments, each of the first sub-pixels has substantially a same third minimum distance from its four directly adjacent ones of the second sub-pixels.

In some embodiments, for first ones of the first sub-pixels, the second minimum distance is greater than the third minimum distance, and the third minimum distance is greater than the first minimum distance.

In some embodiments, for second ones of the first sub-pixels, the second minimum distance is less than the third minimum distance, and the third minimum distance is less than the first minimum distance.

In some embodiments, each of the second sub-pixels has substantially a same minimum distance from its four directly adjacent ones of the third sub-pixels, the substantially same minimum distance being substantially equal to the first minimum distance.

In some embodiments, each of the third sub-pixels has a fourth minimum distance from one of its two directly adjacent ones of the third sub-pixels and a fifth minimum distance from the other of its two directly adjacent ones of the third sub-pixels, the fifth minimum distance being greater than the fourth minimum distance.

In some embodiments, the first sub-pixels in each of the plurality of first groups are positioned substantially equidistantly with respect to each other at a sixth minimum distance, and the first sub-pixels in each of the plurality of third groups are positioned substantially equidistantly with respect to each other at the sixth minimum distance, the sixth minimum distance being greater than any one of the fourth minimum distance and the fifth minimum distance.

In some embodiments, the second sub-pixels in each of the plurality of second groups are positioned substantially equidistantly with respect to each other at a seventh minimum distance, and the second sub-pixels in each of the plurality of fourth groups are positioned substantially equidistantly with respect to each other at the seventh minimum distance, the seventh minimum distance being greater than the fifth minimum distance and less than the sixth minimum distance.

In some embodiments, the first sub-pixels each have an equilateral quadrilateral shape, the second sub-pixels each have a rectangular shape, and the third sub-pixels each have an octagonal shape.

In some embodiments, the third sub-pixels in each of the plurality of first groups each have a length direction substantially parallel to the first direction, and the third sub-pixels in each of the plurality of third groups each have a length direction substantially parallel to the second direction.

In some embodiments, every two adjacent second sub-pixels in each of the plurality of second groups are oriented such that they are rotated by 90 degrees with respect to each other, and every two adjacent second sub-pixels in each of the plurality of fourth groups are oriented such that they are rotated by 90 degrees with respect to each other.

In some embodiments, the first sub-pixels are red sub-pixels, the second sub-pixels are blue sub-pixels, and the third sub-pixels are green sub-pixels.

In some embodiments, the first sub-pixels are blue sub-pixels, the second sub-pixels are red sub-pixels, and the third sub-pixels are green sub-pixels.

In some embodiments, the first sub-pixels each have a first area, the second sub-pixels each have a second area, and the third sub-pixels each have a third area that is smaller than the first area and the second area.

In some embodiments, the blue sub-pixels each have an area larger than an area of each of the red sub-pixels.

According to another aspect of the present disclosure, a display panel is provided, comprising: a display substrate; and the pixel arrangement as described above, the pixel arrangement being formed on the display substrate. The pixel arrangement is arranged such that each of the first direction and the second direction intersects a length direction of the display substrate at approximately 45 degrees.

In some embodiments, the first sub-pixels, the second sub-pixels, and the third sub-pixels are organic electroluminescent sub-pixels.

According to yet another aspect of the present disclosure, a display device is provided comprising the display panel as described above.

According to still yet another aspect of the present disclosure, a set of masks for manufacturing the pixel arrangement as described above is provided, comprising: a first mask defining a plurality of first openings, the plurality of first openings arranged to have a pattern corresponding to a pattern of the first sub-pixels; a second mask defining a plurality of second openings, the plurality of second openings arranged to have a pattern corresponding to a pattern of the second sub-pixels; and a third mask defining a plurality of third openings, the plurality of third openings arranged to have a pattern corresponding to a pattern of the third sub-pixels.

According to still yet another aspect of the present disclosure, a method of manufacturing a pixel arrangement using the set of masks as described above is provided, comprising: providing a display substrate; evaporating a first electroluminescent material, and depositing the evaporated first electroluminescent material onto the display substrate by passing the evaporated first electroluminescent material through the plurality of first openings of the first mask to form the first sub-pixels; evaporating a second electroluminescent material, and depositing the evaporated second electroluminescent material onto the display substrate by passing the evaporated second electroluminescent material through the plurality of second openings of the second mask to form the second sub-pixels; and evaporating a third electroluminescent material, and depositing the evaporated third electroluminescent material onto the display substrate by passing the evaporated third electroluminescent material through the plurality of third openings of the third mask to form the third sub-pixels.

These and other aspects of the present disclosure will be apparent from and elucidated with reference to the embodiment(s) described hereinafter.

BRIEF DESCRIPTION OF THE DRAWINGS

Further details, features and advantages of the present disclosure are disclosed in the following description of exemplary embodiments in conjunction with the accompanying drawings in which.

In the figures, different reference numerals, which are a combination of the same number and different letter suffixes, can be collectively referenced by the number.

DETAILED DESCRIPTION

Figure 1:
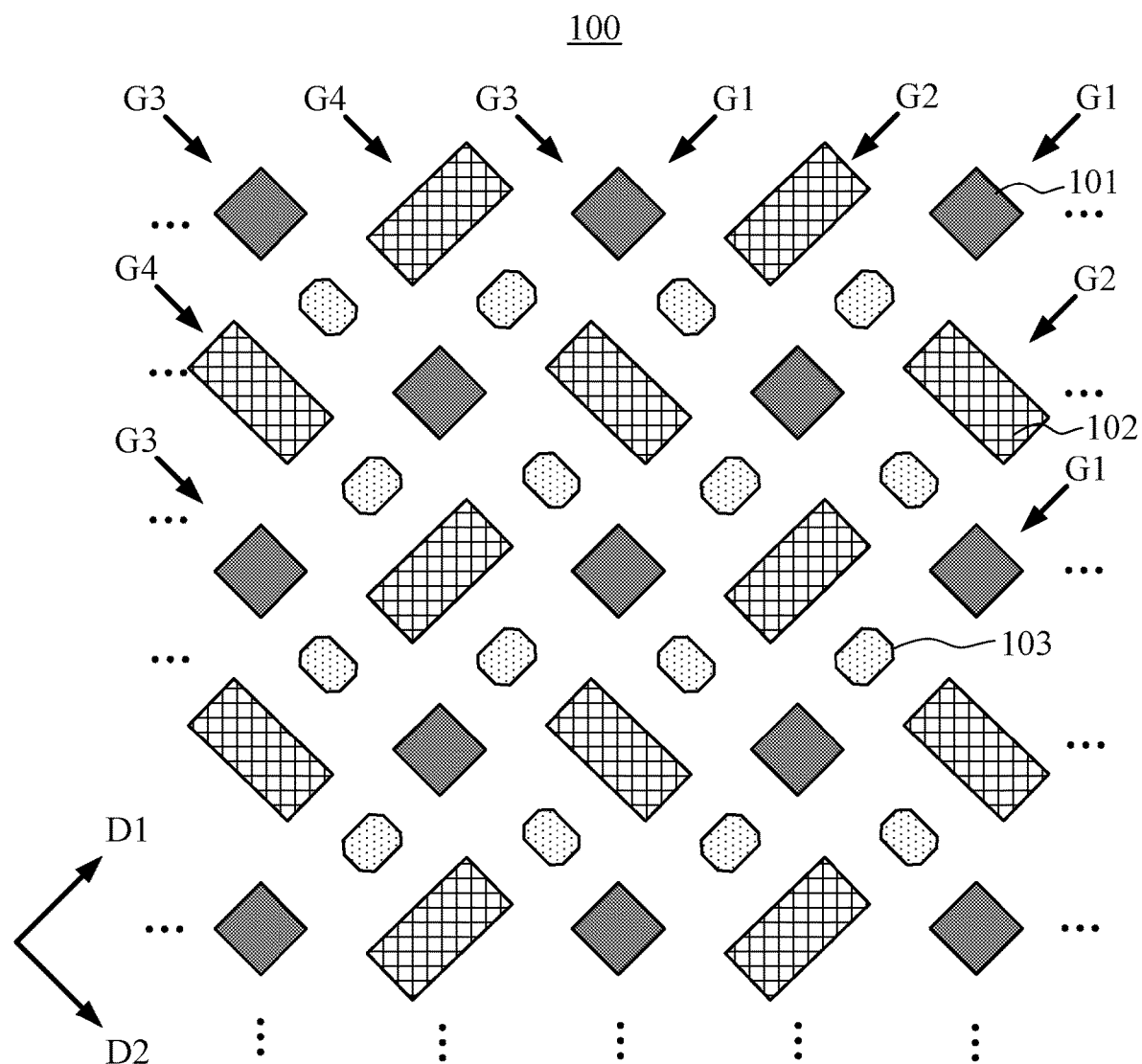
FIG. 1 is a schematic plan view of a pixel arrangement in accordance with an embodiment of the present disclosure.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "directly adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the FIGs are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the accompanying drawings.

FIG. 1 is a schematic plan view of a pixel arrangement 100 in accordance with an embodiment of the present disclosure.

As shown in FIG. 1, the pixel arrangement 100 includes a plurality of first groups of sub-pixels G1 arranged in a first direction D1 and a plurality of second groups of sub-pixels G2 arranged in the first direction D1. The plurality of first groups G1 and the plurality of second groups G2 are alternately arranged in a second direction D2 that intersects (e.g., is perpendicular to) the first direction D1.

Each of the plurality of first groups G1 includes a plurality of first sub-pixels 101 and a plurality of third sub-pixels 103 that are alternately arranged. Each of the plurality of second groups G2 includes a plurality of third sub-pixels 103 and a plurality of second sub-pixels 102 that are alternately arranged. The plurality of first groups G1 and the plurality of second groups G2 are further arranged to form a plurality of third groups of sub-pixels G3 arranged in the second direction D2 and a plurality of fourth groups of sub-pixels G4 arranged in the second direction D2. The plurality of third groups G3 and the plurality of fourth groups G4 are alternately arranged in the first direction D1. Each of the plurality of third groups G3 includes a plurality of first sub-pixels 101 and a plurality of third sub-pixels 103 alternately arranged, and each of the plurality of fourth groups G4 includes a plurality of third sub-pixels 103 and a plurality of second sub-pixels 102 arranged alternately.

Figure 2:
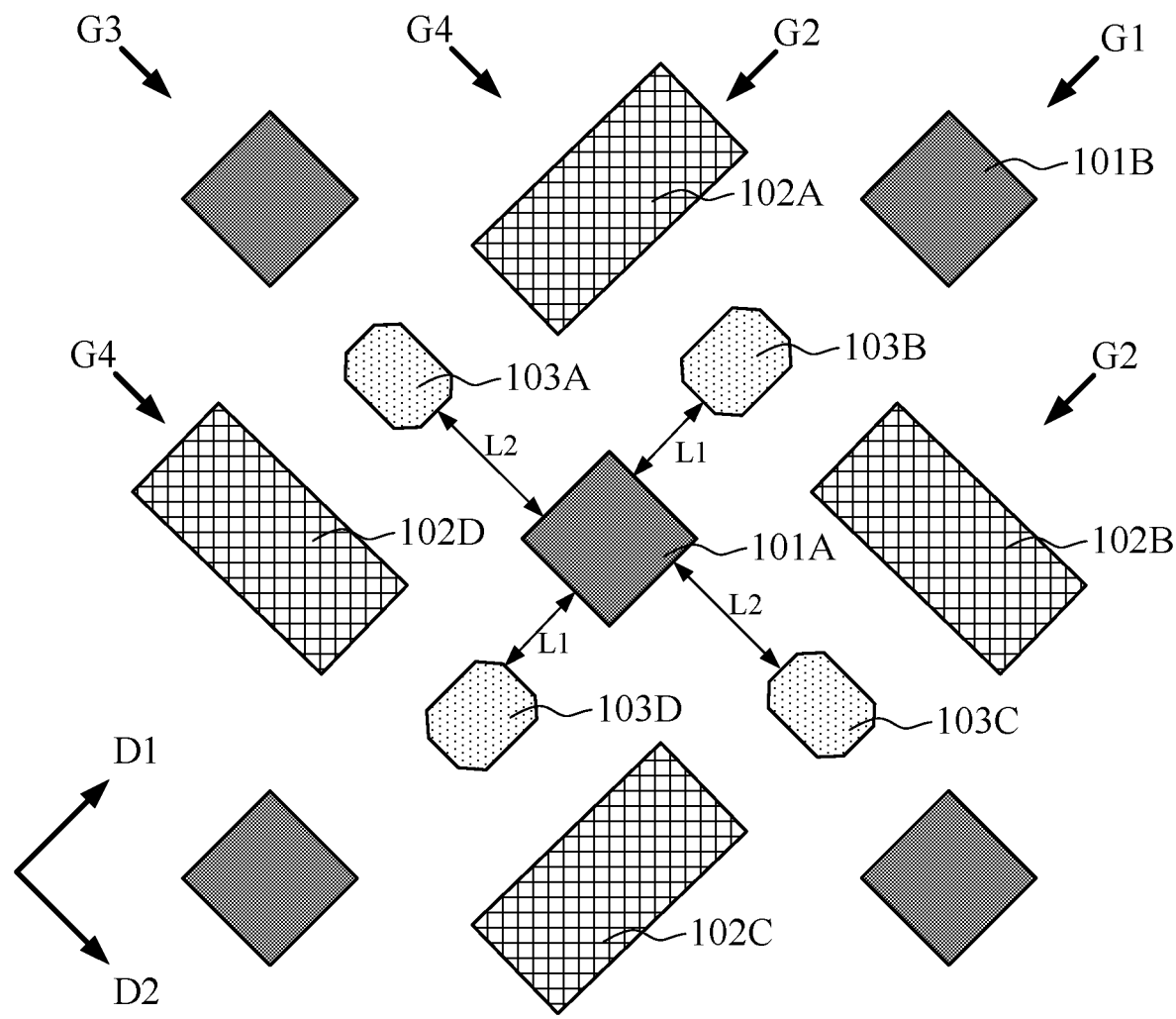
FIG. 2 is a schematic plan view of a partial area of the pixel arrangement of FIG. 1.

FIG. 2 is a schematic plan view of a partial area of the pixel arrangement 100 of FIG. 1.

In this embodiment, each of the first sub-pixels 101 in each of the plurality of first groups G1 has substantially the same first minimum distance from its two directly adjacent ones of the third sub-pixels 103 in that first group G1, and each of the first sub-pixels 101 in each of the plurality of third groups G3 has substantially the same second minimum distance from its two directly adjacent ones of the third sub-pixels 103 in that third group G3, the first minimum distance being unequal to the second minimum distance. In the example of FIG. 2, the first sub-pixel 101A has the same first minimum distance L1 from the two third sub-pixels 103B and 103D directly adjacent thereto in the first group G1, and the first sub-pixel 101A has substantially the same second minimum distance L2 from the two third sub-pixels 103A and 103C directly adjacent thereto in the third group G3. In this example, the first minimum distance L1 is less than the second minimum distance L2. It will be understood that in this document the term "substantially" used in connection with "equidistant", "parallel", "same", "equal to", etc., is intended to encompass deviations as a result of manufacturing processes.

Compared with existing pixel arrangements, the pixel arrangement 100 may allow the first sub-pixels 101, the second sub-pixels 102, and the third sub-pixels 103 to be more closely arranged under the same process conditions, thereby increasing the area of individual sub-pixels as much as possible. This, in turn, facilitates a reduced drive current of the display element and hence an increased lifetime of the display element.

It will be understood that the minimum distance between two sub-pixels refers to the shortest one of the distances between points of one of the two sub-pixels and points of the other of the two sub-pixels. The minimum distance must be larger than or equal to a process limit distance. The process limit distance generally depends on the manufacturing process used. In embodiments in which a fine metal mask (FMM) is used in connection with etching, the process limit distance is about 16 μm. In embodiments in which laser or electroforming, etc., is employed, the process limit distance could be even smaller.

Figure 3:
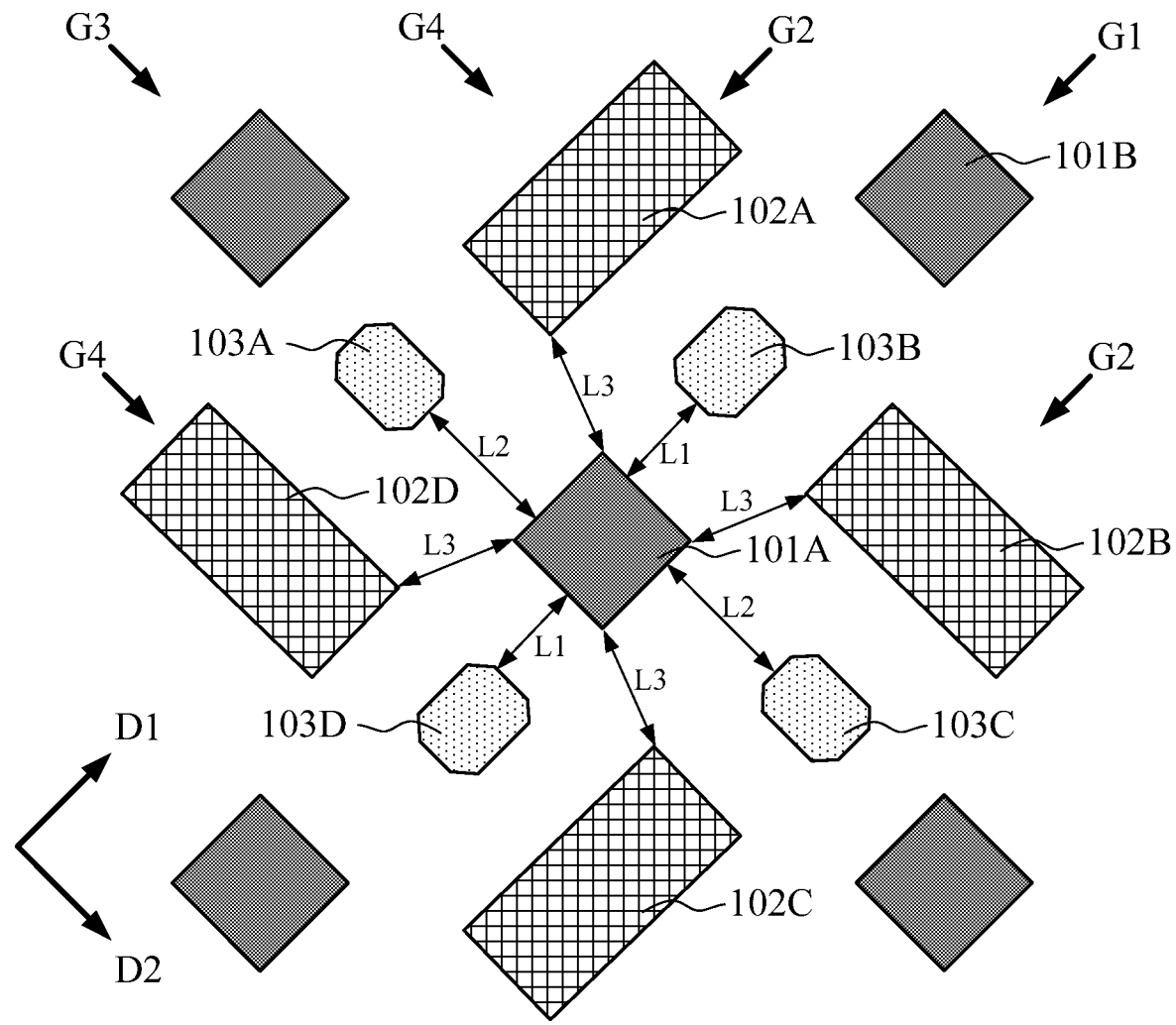
FIG. 3 is a schematic plan view of a partial area of the pixel arrangement of FIG. 1.

FIG. 3 is a schematic plan view of a partial area of the pixel arrangement 100 of FIG. 1, showing the same partial area as in FIG. 2.

In this embodiment, each of the first sub-pixels 101 has substantially the same third minimum distance from its four directly adjacent ones of the second sub-pixels 102. In the example of FIG. 3, the first sub-pixel 101A has substantially the same third minimum distance L3 from the four second sub-pixels 102A, 102B, 102C, and 102D directly adjacent thereto. This provides a relatively uniform distribution of the first sub-pixels 101 relative to the second sub-pixels 102, facilitating the desired display effect.

In this embodiment, for first ones of the first sub-pixels 101 in the pixel arrangement 100, the second minimum distance L2 is greater than the third minimum distance L3, and the third minimum distance L3 is greater than the first minimum distance L1. In the example of FIG. 3, the second minimum distance L2 between the first sub-pixel 101A and the third sub-pixel 103A is greater than the third minimum distance L3 between the first sub-pixel 101A and the second sub-pixel 102A, and the third minimum distance L3 is further greater than the first minimum distance L1 between the first sub-pixel 101A and the third sub-pixel 103B. This provides a specific sub-pixel pattern that facilitates a compact arrangement of individual sub-pixels.

Figure 4:
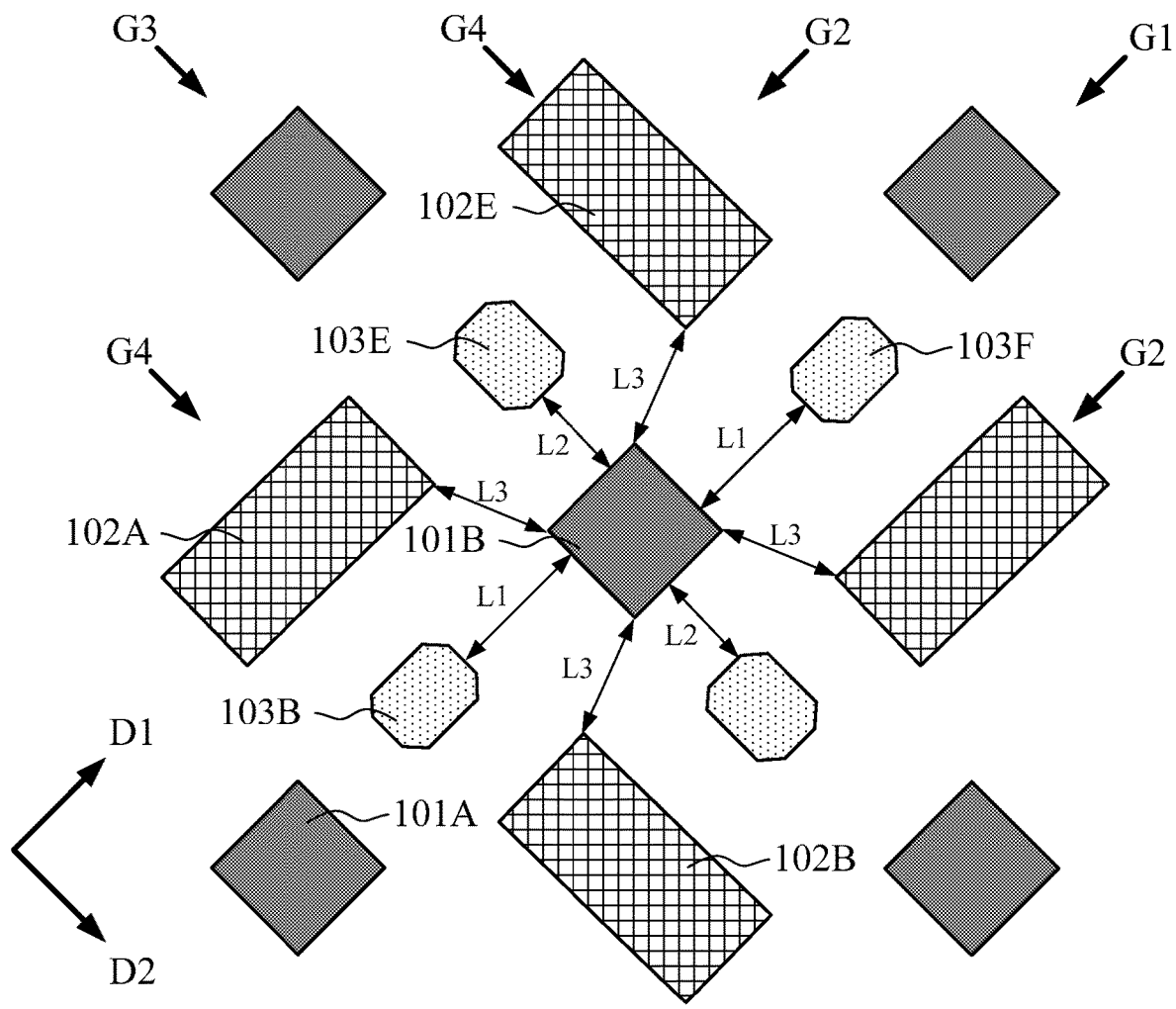
FIG. 4 is a schematic plan view of a partial area of the pixel arrangement of FIG. 1.

FIG. 4 is a schematic plan view of a partial area of the pixel arrangement 100 of FIG. 1, showing a partial area of the pixel arrangement 100 centered on the first sub-pixel 101B of FIG. 2.

In this embodiment, for first ones of the first sub-pixels 101 in the pixel arrangement 100, the second minimum distance L2 is greater than the third minimum distance L3, and the third minimum distance L3 is greater than the first minimum distance L1. In the example of FIG. 4, the second minimum distance L2 between the first sub-pixel 101B and the third sub-pixel 103E is smaller than the third minimum distance L3 between the first sub-pixel 101B and the second sub-pixel 102E, and the third minimum distance L3 is further smaller than the first minimum distance L1 between the first sub-pixel 101B and the third sub-pixel 103F. This provides a specific sub-pixel pattern that facilitates a compact arrangement of individual sub-pixels.

Figure 5:
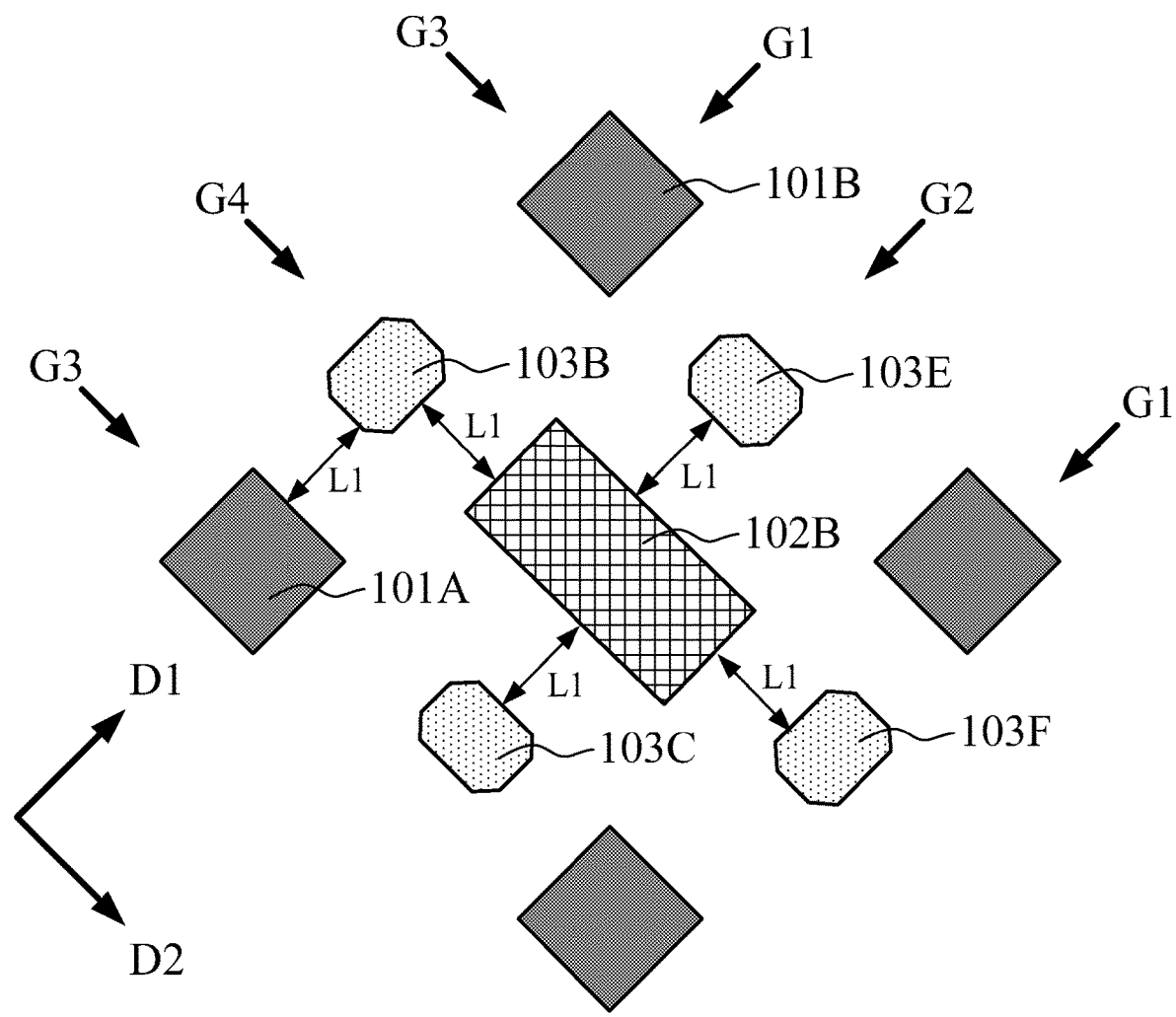
FIG. 5 is a schematic plan view of a partial area of the pixel arrangement of FIG. 1.

FIG. 5 is a schematic plan view of a partial area of the pixel arrangement 100 of FIG. 1, showing a partial area of the pixel arrangement 100 centered on the second sub-pixel 102B of FIG. 2.

In this embodiment, each of the second sub-pixels 102 has substantially the same minimum distance from its four directly adjacent ones of the third sub-pixels 103, with the same minimum distance equal to the first minimum distance L1. In the example of FIG. 5, the second sub-pixel 102B has substantially the same minimum distance from the four third sub-pixels 103B, 103C, 103E, and 103F directly adjacent thereto. In this example, the substantially same minimum distance is substantially equal to the first minimum distance L1 between the first sub-pixel 101A and the third sub-pixel 103B. This provides a relatively uniform distribution of the first sub-pixels 101, the second sub-pixels 102, and the third sub-pixels 103, which is advantageous for achieving a desired display effect.

Figure 6:
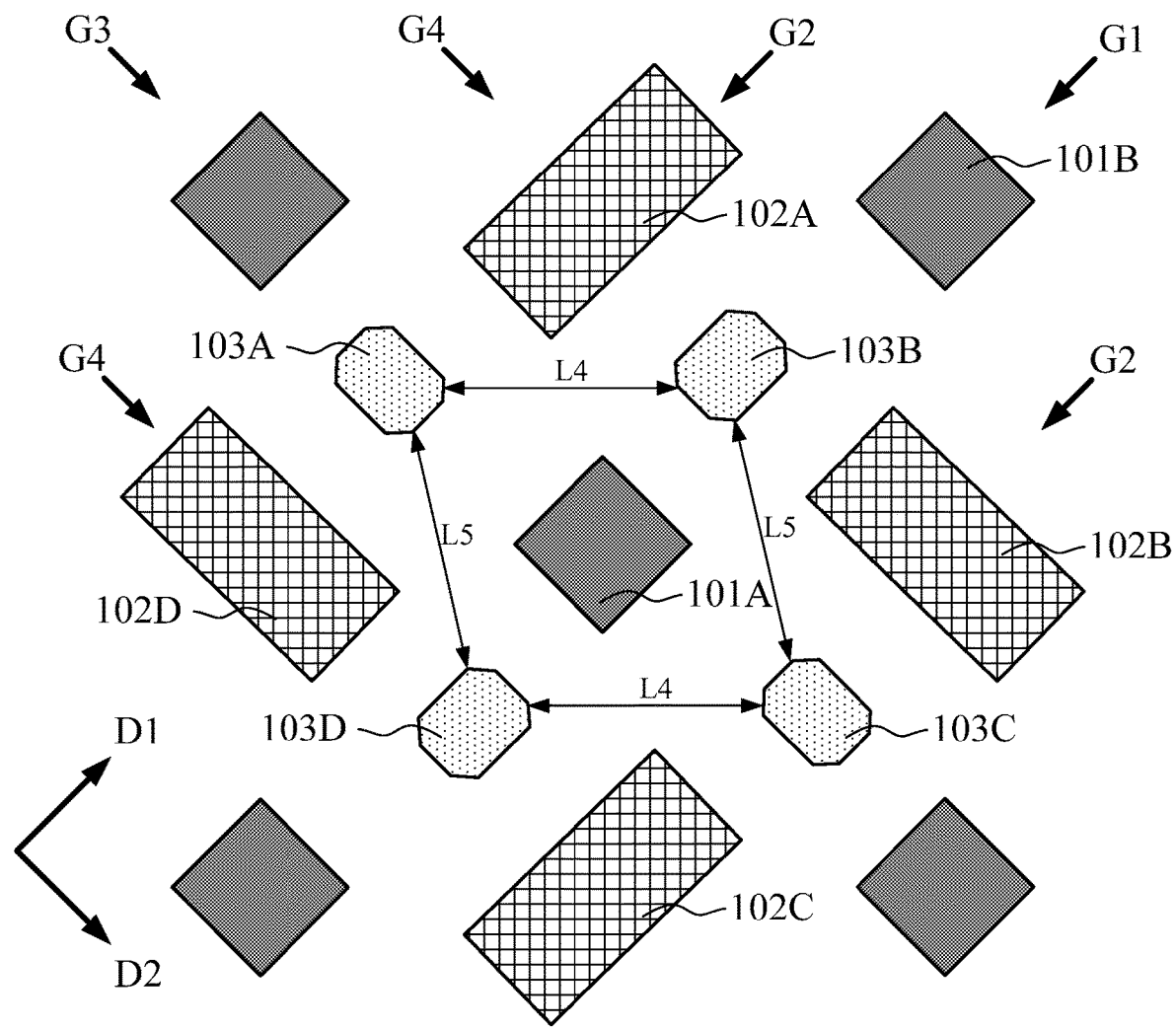
FIG. 6 is a schematic plan view of a partial area of the pixel arrangement of FIG. 1.

FIG. 6 is a schematic plan view of a partial area of the pixel arrangement 100 of FIG. 1, showing the same partial area as in FIG. 2.

In this embodiment, each of the third sub-pixels 103 has a fourth minimum distance from one of its two directly adjacent ones of the third sub-pixels 103, and a fifth minimum distance from the other of its two immediately adjacent ones of the third sub-pixels 103, the fifth minimum distance being greater than the fourth minimum distance. In the example of FIG. 6, the third sub-pixel 103A has the fourth minimum distance L4 from one (103B) of the two third sub-pixels 103B and 103D directly adjacent thereto and the fifth minimum distance L5 from the other (103D) of the two third sub-pixels 103B and 103D directly adjacent thereto. Similarly, the third sub-pixel 103C has the fourth minimum distance L4 from one (103D) of the two third sub-pixels 103B and 103D directly adjacent thereto and the fifth minimum distance L5 from the other (103B) of the two third sub-pixels 103B and 103D directly adjacent thereto. In this example, the fifth minimum distance L5 is greater than the fourth minimum distance L4. This provides a specific sub-pixel pattern that facilitates a compact arrangement of individual sub-pixels.

Figure 7:
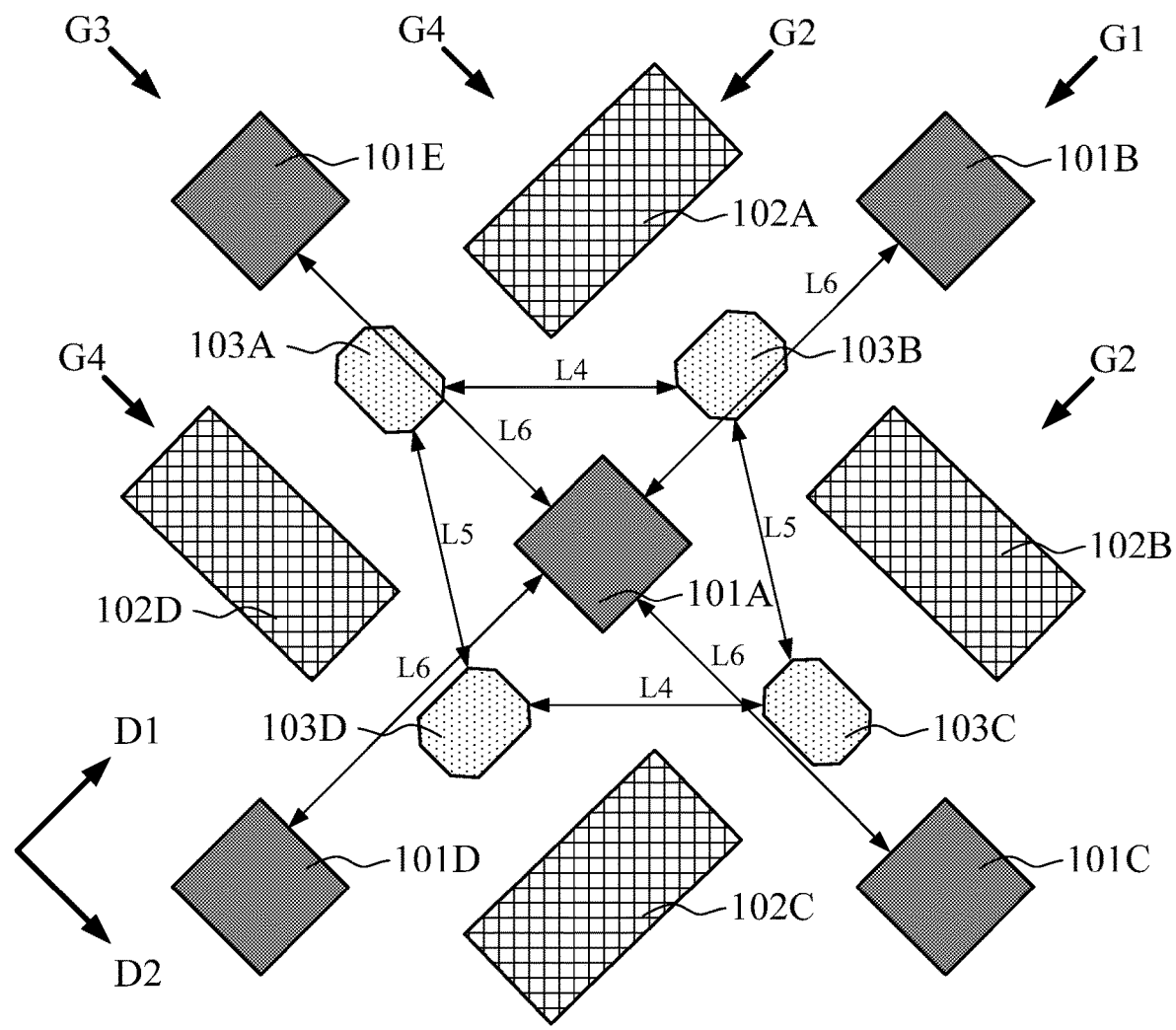
FIG. 7 is a schematic plan view of a partial area of the pixel arrangement of FIG. 1.

FIG. 7 is a schematic plan view of a partial area of the pixel arrangement 100 of FIG. 1, further illustrating the positional relationship between the first sub-pixels 101 on the basis of FIG. 6.

In this embodiment, the first sub-pixels 101 in each of the plurality of first groups G1 are positioned substantially equidistantly with respect to each other at a sixth minimum distance, and the first sub-pixels 101 in each of the plurality of third groups G3 are positioned substantially equidistantly with respect to each other at the sixth minimum distance, the sixth minimum distance being greater than any one of the fourth minimum distance and the fifth minimum distance. In the example of FIG. 7, the first sub-pixels 101B, 101A, and 101D in the first group G1 are positioned substantially equidistant with respect to each other at the sixth minimum distance L6, and the first sub-pixels 101E, 101A and 101C in the third group G3 are positioned substantially equidistantly with respect to each other at the sixth minimum distance L6. In this example, the sixth minimum distance L6 is greater than the fifth minimum distance L5 defined above, which in turn is greater than the fourth minimum distance L4 defined above. This provides a relatively uniform distribution of each of the first sub-pixels 101, which is advantageous for achieving a desired display effect.

Figure 8:
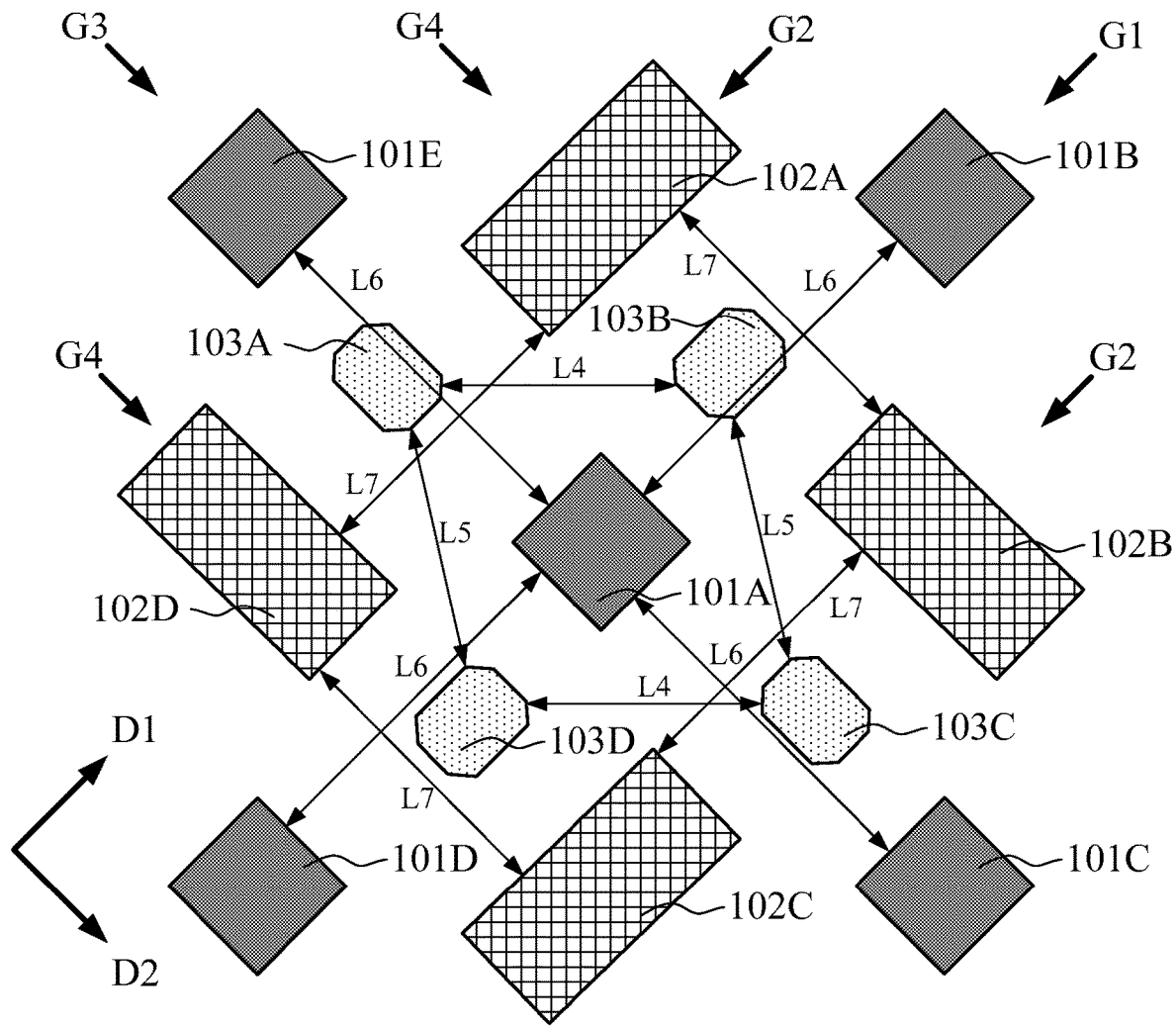
FIG. 8 is a schematic plan view of a partial area of the pixel arrangement of FIG. 1.

FIG. 8 is a schematic plan view of a partial area of the pixel arrangement 100 of FIG. 1, further illustrating the positional relationship between the second sub-pixels 102 on the basis of FIG. 6.

In this embodiment, the second sub-pixels 102 in each of the plurality of second groups G2 are positioned substantially equidistantly with respect to each other at a seventh minimum distance, and the second sub-pixels 102 in each of the plurality of fourth groups G4 are positioned substantially equidistantly with respect to each other at the seventh minimum distance, the seventh minimum distance being greater than the fifth minimum distance and less than the sixth minimum distance. In the example of FIG. 8, in the two second groups G2 as shown, the second sub-pixels 102A and 102D are positioned with respect to each other at the seventh minimum distance L7, and the second sub-pixels 102B and 102C are positioned with respect to each other at the seventh minimum distance L7. In the two fourth groups G4 as shown, the second sub-pixels 102A and 102B are positioned with respect to each other at the seventh minimum distance L7, and the second sub-pixels 102D and 102C are positioned with respect to each other at the seventh minimum distance L7. This provides a relatively uniform distribution of the second sub-pixels 102, which is advantageous for achieving a desired display effect.

In the embodiments described above, the first sub-pixels 101 each have a shape of an equilateral quadrangle (specifically, a square), the second sub-pixels 102 each have a rectangular shape, and the third sub-pixels 103 each have an octagonal shape. In embodiments, the third sub-pixels 103 in each of the plurality of first groups G1 each have a length direction substantially parallel to the first direction D1, and the third sub-pixels 103 in each of the plurality of third groups G3 each have a length direction substantially parallel to the second direction D2. In embodiments, every two adjacent second sub-pixels 102 in each of the plurality of second groups G2 are oriented such that they are rotated by 90 degrees with respect to each other, and every two adjacent second sub-pixels 102 in each of the plurality of fourth groups G4 are oriented such that they are rotated by 90 degrees with respect to each other. For example, as shown in FIG. 8, the adjacent two second sub-pixels 102B and 102C in the second group G2 are rotated by 90 degrees with respect to each other, and the adjacent two second sub-pixels 102D and 102C in the fourth group G4 are rotated by 90 degrees with respect to each other. This provides a specific sub-pixel pattern that facilitates a compact arrangement of individual sub-pixels.

Although an exemplary arrangement of the first sub-pixel 101, the second sub-pixel 102, and the third sub-pixel 103 is described above in connection with FIGS. 1 to 8, the present disclosure is not limited thereto. For example, the first sub-pixel 101, the second sub-pixel 102, and the third sub-pixel 103 may have a shape selected from a group consisting of a rectangle, an ellipse, a convex polygon, a concave polygon, a triangle, and a circle. Other irregular shapes are also possible. In practice, the shape, area, orientation, and relative position of the first sub-pixel 101, the second sub-pixel 102, and the third sub-pixel 103 can be designed as needed.

In the embodiments described above, the third sub-pixel 103 may be a green sub-pixel. In some embodiments, the first sub-pixel 101 can be a red sub-pixel and the second sub-pixel 102 can be a blue sub-pixel. Alternatively, the first sub-pixel 101 may be a blue sub-pixel, and the second sub-pixel 102 may be a red sub-pixel. Since the human eye is sensitive to green light, the area of the third sub-pixel 103 may be smaller than the area of the first sub-pixel 101 and may be smaller than the area of the second sub-pixel 102. That is, the area of the green sub-pixel is smaller than the area of the red sub-pixel and smaller than the area of the blue sub-pixel.

In embodiments, the second sub-pixel 102 and the first sub-pixel 101 may have the same area, that is, the red sub-pixel and the blue sub-pixel have substantially the same area. Alternatively, the second sub-pixel 102 may have an area different from the area of the first sub-pixel 101, that is, the red sub-pixel has an area different from the area of the blue sub-pixel. In general, the area of the blue sub-pixel can be set larger than the area of the red sub-pixel because the blue sub-pixel has lower luminous efficiency and lifetime than the red sub-pixel.

Figure 9:
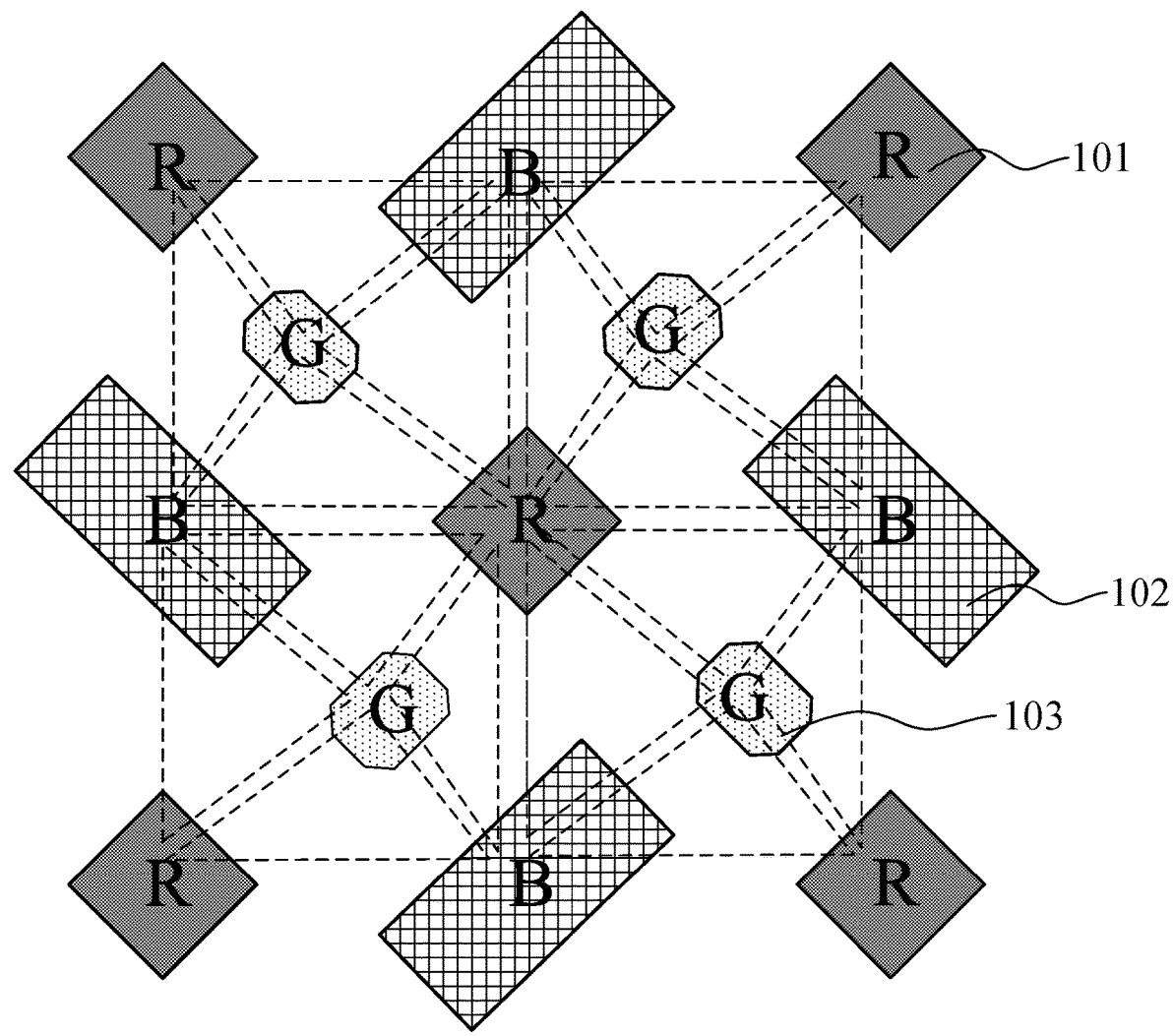
FIG. 9 is a schematic view generally showing a principle of color-borrowing of a pixel arrangement according to an embodiment of the present disclosure.

FIG. 9 generally illustrates the principle of color-borrowing of a pixel arrangement in accordance with an embodiment of the present disclosure.

In this example, the first sub-pixel 101 is a red sub-pixel, the second sub-pixel 102 is a blue sub-pixel, and the third sub-pixel 103 is a green sub-pixel. The area of the second sub-pixel 102 is substantially the same as the area of the first sub-pixel 101, that is, the area of the red sub-pixel is substantially the same as the area of the blue sub-pixel.

As shown in FIG. 9, the green sub-pixel the red sub-pixel R, and the blue sub-pixel B located at the vertices of each of the broken-line triangles form a virtual pixel. Advantageously, there is always a common sub-pixel between directly adjacent broken-line triangles. This provides a higher virtual resolution than the physical resolution, which improves the display effect. Furthermore, as described above, the first sub-pixel 101, the second sub-pixel 102, and the third sub-pixel 103 are allowed to be arranged more closely, thereby providing a larger area per sub-pixel than the existing pixel arrangements.

Figure 10:
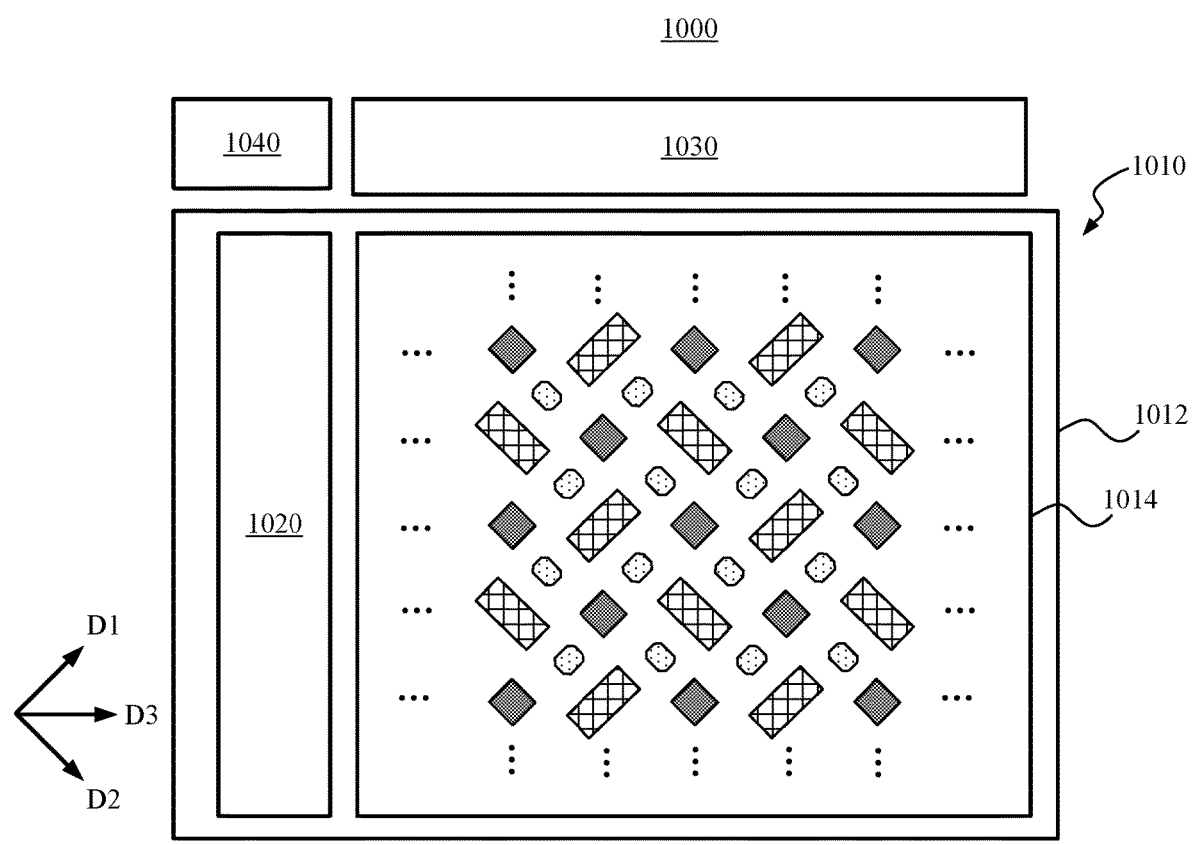
FIG. 10 is a schematic plan view of a display device according to an embodiment of the present disclosure.

FIG. 10 is a schematic plan view of a display device 1000 in accordance with an embodiment of the present disclosure.

Referring to FIG. 10, the display device 1000 includes a display panel 1010, a scan driver 1020, a data driver 1030, and a timing controller 1040.

The display panel 1010 includes a display substrate 1012 and a pixel arrangement 1014 formed on the display substrate 1012. The pixel arrangement 1014 may take the form of any of the pixel arrangement 100 and its variations described above with respect to FIGS. 1 to 9. The pixel arrangement 1014 is arranged such that each of the first direction D1 and the second direction D2 (according to which the configurations of the pixel arrangement 100 and its various modifications have been described) intersects a length direction D3 of the display substrate 1012 at approximately 45 degrees. The term "approximately" here is intended to cover a certain range of error, such as ±10%. For example, 40.5 degrees is considered to be "approximately 45 degrees." The sub-pixels in the pixel arrangement 1014 may be organic electroluminescence sub-pixels, although the disclosure is not limited thereto.

The scan driver 1020 outputs gate scan signals to the display panel 1010. In some exemplary embodiments, the scan driver 1020 may be directly integrated in the display substrate 1012 as a gate driver on array (GOA) circuit. Alternatively, the scan driver 1020 may be connected to the display panel 1010 by a Tape Carrier Package (TCP). The implementation of the scan driver 1020 may be known, a detailed description of which is thus omitted.

The data driver 1030 outputs data voltages to the display panel 1010. In some embodiments, the data driver 1030 may include a plurality of data driver chips which operate in parallel. The implementation of the data driver 1030 may be known, a detailed description of which is thus omitted.

The timing controller 1040 controls the operations of the scan driver 1020 and the data driver 1030. Specifically, the timing controller 1040 outputs data control signals and image data to control the driving operation of the data driver 1030, and outputs gate control signals to control the driving operation of the scan driver 1020. The data control signals and image data are applied to the data driver 1030. The gate control signals are applied to the scan driver 1020. The implementation of the timing controller 1040 may be known, and a detailed description of which is thus omitted.

The display device 1000 has the same advantages as those of the pixel arrangement embodiments described above with respect to FIGS. 1 to 9, which will not be repeated herein. By way of example and not limitation, the display device 1000 can be any product or component having a display function, such as a cell phone, a tablet, a television, a display, a notebook computer, a digital photo frame, a navigator, and the like.

Figure 11A:
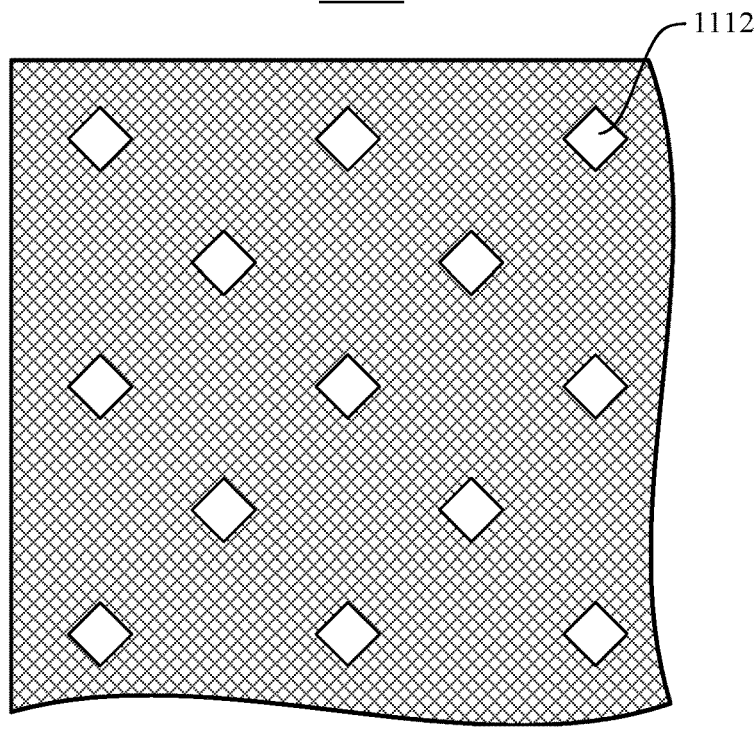
FIGS. 11A, 11B, and 11C are schematic plan views of masks according to an embodiment of the present disclosure.
Figure 11B:
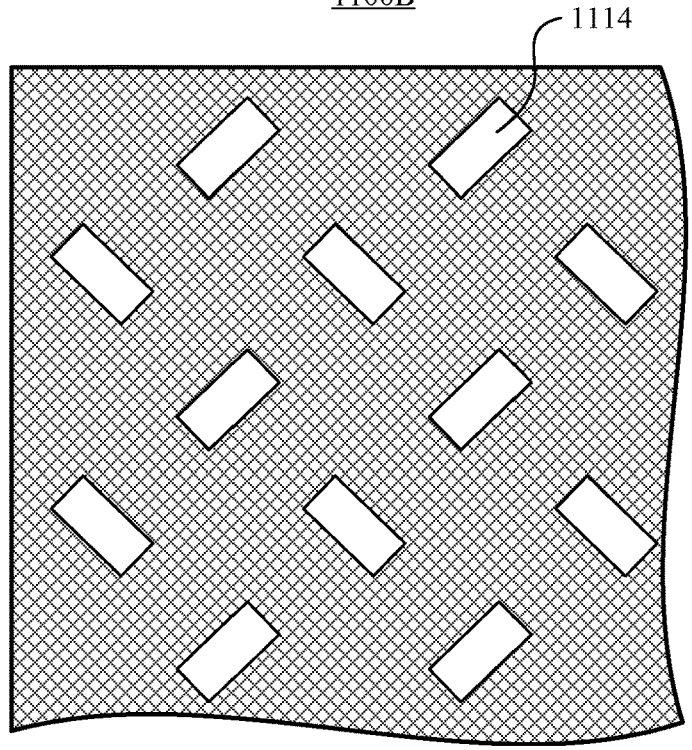
Figure 11C:
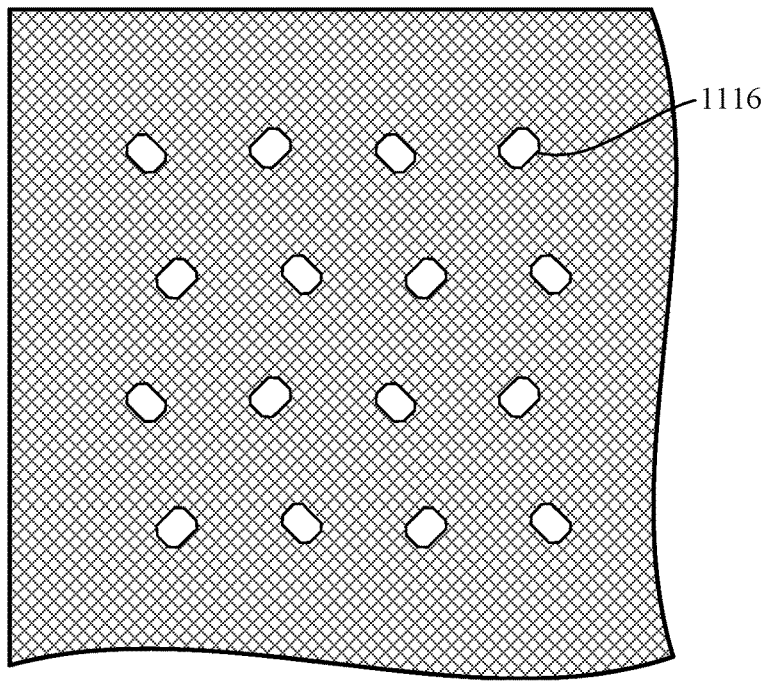

FIGS. 11A, 11B, and 11C are schematic plan views of a set of masks in accordance with an embodiment of the present disclosure. The set of masks includes a first mask 1100A, a second mask 1100B, and a third mask 1100C.

Referring to FIG. 11A, only a portion of the first mask 1100A is shown. The first mask 1100A defines a plurality of first openings 1112. The plurality of first openings 1112 are arranged to have a pattern corresponding to the pattern of the first sub-pixels of any one of the pixel arrangement 100 or its variations described above with respect to FIGS. 1 to 9. In this example, the plurality of first openings 1112 are arranged to have a pattern corresponding to the pattern of the first sub-pixels of the pixel arrangement 100 of FIG. 1. In some embodiments, the mask 1100A is a fine metal mask that can be used in an evaporation process to form a desired pixel pattern.

Referring to FIG. 11B, only a portion of the second mask 1100B is shown. The second mask 1100B defines a plurality of second openings 1114. The plurality of second openings 1114 are arranged to have a pattern corresponding to the pattern of the second sub-pixels of any one of the pixel arrangement 100 or its variations described above with respect to FIGS. 1 to 9. In this example, the plurality of second openings 1114 are arranged to have a pattern corresponding to the pattern of the second sub-pixels of the pixel arrangement 100 of FIG. 1. In some embodiments, the mask 1100B is a fine metal mask that can be used in an evaporation process to form a desired pixel pattern.

Referring to FIG. 11C, only a portion of the third mask 1100C is shown. The third mask 1100C defines a plurality of third openings 1116. The plurality of third openings 1116 are arranged to have a pattern corresponding to the pattern of the third sub-pixels of any one of the pixel arrangement 100 or its variations described above with respect to FIGS. 1 to 9. In this example, the plurality of third openings 1116 are arranged to have a pattern corresponding to the pattern of the third sub-pixels of the pixel arrangement 100 of FIG. 1. In some embodiments, the mask 1100C is a fine metal mask that can be used in an evaporation process to form a desired pixel pattern.

The masks 1100A, 1100B, and 1100C may provide the same advantages as those of the pixel arrangement embodiments described above with respect to FIGS. 1 to 9, which are not repeated herein.

Figure 12:
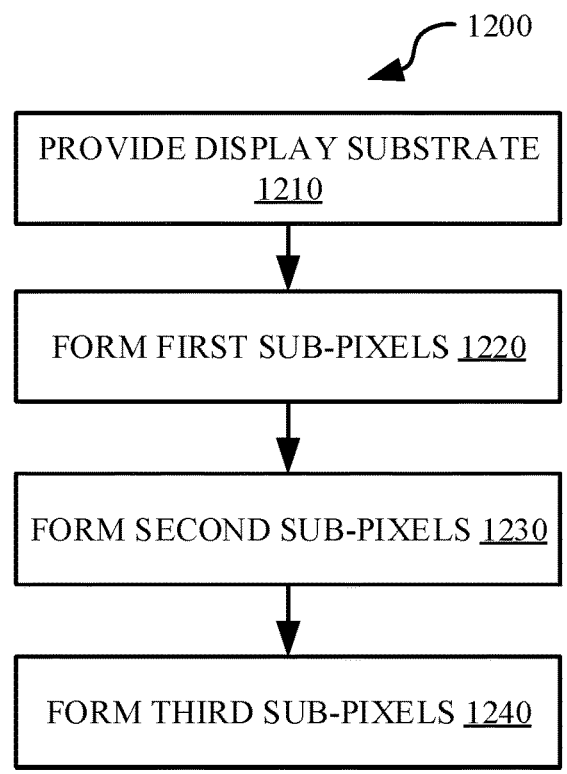
FIG. 12 is a flow chart of a method of manufacturing a pixel arrangement in accordance with an embodiment of the present disclosure.

FIG. 12 is a flow diagram of a method 1200 of manufacturing a pixel arrangement in accordance with an embodiment of the present disclosure. Embodiments of the pixel arrangement described above with respect to FIGS. 1 to 9 can be implemented using the method 1200 and the masks 1100A, 1100B, and 1100C.

Referring to FIG. 12, at step 1210, a display substrate is provided. The display substrate is typically a back plate that has been provided with driving circuits formed of, for example, thin film transistors (TFTs). At step 1220, a first electroluminescent material is evaporated and passes through the plurality of first openings 1112 of the first mask 1100A, with the evaporated first electroluminescent material deposited onto the display substrate to form the first sub-pixels 101. At step 1230, a second electroluminescent material is evaporated and passes through the plurality of second openings 1114 of the second mask 1100B, with the evaporated second electroluminescent material deposited onto the display substrate to form the second sub-pixels 102. At step 1240, the third electroluminescent material is evaporated and passes through the plurality of third openings 1116 of the third mask 1100C, with the evaporated third electroluminescent material deposited onto the display substrate to form the third sub-pixels 103. Steps 1220 to 1240 are generally referred to as evaporation, by which the pixel pattern will be formed at predetermined positions on the display substrate. It will be understood that steps 1220 to 1240 can be performed in an order different from that illustrated and described. In some embodiments, the electroluminescent materials may be organic electroluminescent materials. Alternatively, the electroluminescent materials may also be inorganic electroluminescent materials.

Variations to the disclosed embodiments can be understood and effected by those skilled in the art from a study of the drawings, the disclosure, and the appended claims. Although the various operations are depicted in the drawings in a particular order, this should not be construed as requiring that the operations be performed in the particular order shown or in a sequential order, nor should it be construed as requiring all of the operations shown to be performed to achieve the desired result. In the claims, the word "comprising" does not exclude other elements or steps, and the indefinite article "a" or "an" does not exclude a plurality. The mere fact that certain measures are recited in mutually different dependent claims does not indicate that the measures cannot be used to advantage.

What is claimed is:

1. A pixel arrangement comprising:
   a plurality of first groups of sub-pixels arranged in a first direction, each of the plurality of first groups comprising a plurality of first sub-pixels and a first plurality of third sub-pixels arranged alternately; and
   a plurality of second groups of sub-pixels arranged in the first direction, each of the plurality of second groups comprising a second plurality of third sub-pixels and a plurality of second sub-pixels arranged alternately,
   wherein the plurality of first groups and the plurality of second groups are alternately arranged in a second direction intersecting the first direction,
   wherein the plurality of first groups and the plurality of second groups are arranged to form a plurality of third groups of sub-pixels arranged in the second direction and a plurality of fourth groups of sub-pixels arranged in the second direction,
   wherein the plurality of third groups and the plurality of fourth groups are alternately arranged in the first direction,
   wherein each of the plurality of third groups comprise a plurality of first sub-pixels and a third plurality of third sub-pixels alternately arranged,
   wherein each of the plurality of fourth groups comprise a fourth plurality of third sub-pixels and a plurality of second sub-pixels arranged alternately, and
   wherein each of the plurality of first sub-pixels in each of the plurality of first groups has a same first minimum distance from its two directly adjacent ones of the first plurality of third sub-pixels in that first group,
   wherein each of the plurality of first sub-pixels in each of the plurality of third groups has a same second minimum distance from its two directly adjacent ones of the third plurality of third sub-pixels in that third group, and
   wherein the first minimum distance is unequal to the second minimum distance.

2. The pixel arrangement of claim 1, wherein each of the plurality of first sub-pixels has substantially a same third minimum distance from four directly adjacent ones of the plurality of second sub-pixels.

3. The pixel arrangement of claim 2, wherein for first ones of the plurality of first sub-pixels, the second minimum distance is greater than the third minimum distance, and the third minimum distance is greater than the first minimum distance.

4. The pixel arrangement of claim 3, wherein each of the plurality of second sub-pixels has a substantially same minimum distance from its four directly adjacent ones of the third sub-pixels, the substantially same minimum distance being substantially equal to the first minimum distance.

5. The pixel arrangement of claim 2, wherein for second ones of the plurality of first sub-pixels, the second minimum distance is less than the third minimum distance, and the third minimum distance is less than the first minimum distance.

6. The pixel arrangement of claim 1, wherein each of the first, second, third, or fourth plurality of third sub-pixels has a fourth minimum distance from one of its two directly adjacent ones of the first, second, third, or fourth plurality of third sub-pixels and a fifth minimum distance from another of its two directly adjacent ones of the first, second, third, or fourth plurality of third sub-pixels, the fifth minimum distance being greater than the fourth minimum distance.

7. The pixel arrangement of claim 6,
   wherein the plurality of first sub-pixels in each of the plurality of first groups are positioned substantially equidistantly with respect to each other at a sixth minimum distance, and
   wherein the plurality of first sub-pixels in each of the plurality of third groups are positioned substantially equidistantly with respect to each other at the sixth minimum distance, the sixth minimum distance being greater than any one of the fourth minimum distance and the fifth minimum distance.

8. The pixel arrangement of claim 7,
wherein the plurality of second sub-pixels in each of the plurality of second groups are positioned substantially equidistantly with respect to each other at a seventh minimum distance, and
wherein the plurality of second sub-pixels in each of the plurality of fourth groups are positioned substantially equidistantly with respect to each other at the seventh minimum distance, the seventh minimum distance being greater than the fifth minimum distance and less than the sixth minimum distance.

9. The pixel arrangement of claim 1,
wherein the plurality of first sub-pixels each have an equilateral quadrilateral shape,
wherein the plurality of second sub-pixels each have a rectangular shape, and
wherein the first, second, third, or fourth plurality of third sub-pixels each have an octagonal shape.

10. The pixel arrangement of claim 9,
wherein the first, second, third, or fourth plurality of third sub-pixels in each of the plurality of first groups each have a length direction substantially parallel to the first direction, and
wherein the first, second, third, or fourth plurality of third sub-pixels in each of the plurality of third groups each have a length direction substantially parallel to the second direction.

11. The pixel arrangement of claim 9,
wherein every two adjacent second sub-pixels in each of the plurality of second groups are oriented such that they are rotated by 90 degrees with respect to each other, and
wherein every two adjacent second sub-pixels in each of the plurality of fourth groups are oriented such that they are rotated by 90 degrees with respect to each other.

12. The pixel arrangement of claim 1, wherein the plurality of first sub-pixels comprise red sub-pixels, wherein the plurality of second sub-pixels comprise blue sub-pixels, and wherein the third sub-pixels comprise green sub-pixels.

13. The pixel arrangement of claim 12, wherein the plurality of first sub-pixels each have a first area, wherein the plurality of second sub-pixels each have a second area, and wherein the third sub-pixels each have a third area that is smaller than the first area and the second area.

14. The pixel arrangement of claim 13, wherein the blue sub-pixels each have an area larger than an area of each of the red sub-pixels.

15. The pixel arrangement of claim 1, wherein the plurality of first sub-pixels comprise blue sub-pixels, wherein the plurality of second sub-pixels comprise red sub-pixels, and wherein the third sub-pixels comprise green sub-pixels.

16. A display panel comprising:
a display substrate; and
the pixel arrangement of claim 1, the pixel arrangement is on the display substrate,
wherein the pixel arrangement is arranged such that each of the first direction and the second direction intersects a length direction of the display substrate at approximately 45 degrees.

17. The display panel of claim 16, wherein the plurality of first sub-pixels, the plurality of second sub-pixels, and ones of the first, second, third, or fourth plurality of the third sub-pixels comprise organic electroluminescent sub-pixels.

18. A display device comprising the display panel of claim 16.

19. A set of masks for manufacturing the pixel arrangement of claim 1, comprising:
a first mask defining a plurality of first openings, the plurality of first openings arranged to have a pattern corresponding to a pattern of the plurality of first sub-pixels;
a second mask defining a plurality of second openings, the plurality of second openings arranged to have a pattern corresponding to a pattern of the plurality of second sub-pixels; and
a third mask defining a plurality of third openings, the plurality of third openings arranged to have a pattern corresponding to a pattern of the first, second, third, or fourth plurality of third sub-pixels.

20. A method of manufacturing a pixel arrangement using the set of masks of claim 19, comprising:
providing a display substrate;
evaporating a first electroluminescent material, and depositing the evaporated first electroluminescent material onto the display substrate by passing the first electroluminescent material that was evaporated through the plurality of first openings of the first mask to form the plurality of first sub-pixels;
evaporating a second electroluminescent material, and depositing the second electroluminescent material that was evaporated onto the display substrate by passing the evaporated second electroluminescent material through the plurality of second openings of the second mask to form the plurality of second sub-pixels; and
evaporating a third electroluminescent material, and depositing the third electroluminescent material that was evaporated onto the display substrate by passing the evaporated third electroluminescent material through the plurality of third openings of the third mask to form the first, second, third, or fourth plurality of third sub-pixels.

* * * * *